United States Patent
Smart et al.

[11] Patent Number: 5,892,834
[45] Date of Patent: Apr. 6, 1999

[54] AUDIO LEVEL DYNAMIC RANGE COMPRESSION

[75] Inventors: David J Smart; Karl Westhead; Martin Page, all of South Woodham Ferrers, United Kingdom

[73] Assignee: Ford Motor Company, Dearborn, Mich.

[21] Appl. No.: 885,914

[22] Filed: Jun. 30, 1997

[51] Int. Cl.[6] ................................................. H03G 7/00
[52] U.S. Cl. ............................................ 381/106; 333/14
[58] Field of Search ................................... 381/106, 102, 381/104, 107–109; 333/14; 455/72

[56] References Cited

U.S. PATENT DOCUMENTS

| | | | |
|---|---|---|---|
| 3,732,371 | 5/1973 | Burwen . | |
| 4,739,514 | 4/1988 | Short et al. | 381/103 |
| 4,947,133 | 8/1990 | Thomas | 381/106 |
| 5,091,957 | 2/1992 | Anderson et al. | 333/14 |
| 5,170,437 | 12/1992 | Strahm | 381/102 |
| 5,303,308 | 4/1994 | Larsen et al. | 381/106 |
| 5,396,562 | 3/1995 | Ishimitsu et al. | 333/14 |
| 5,404,315 | 4/1995 | Nakano et al. | 381/102 |
| 5,444,788 | 8/1995 | Orban | 381/106 |
| 5,463,695 | 10/1995 | Werrbach | 381/106 |
| 5,471,651 | 11/1995 | Wilson | 381/106 |
| 5,483,600 | 1/1996 | Werrbach | 381/106 |
| 5,530,767 | 6/1996 | Yoshida | 381/72 |
| 5,631,648 | 5/1997 | Yamada et al. | 333/14 |
| 5,631,968 | 5/1997 | Frey et al. | 333/14 |
| 5,633,939 | 5/1997 | Kitani et al. | 381/106 |
| 5,666,430 | 9/1997 | Rzeszewski | 381/102 |
| 5,754,973 | 5/1998 | Akune | 381/106 |
| 5,757,940 | 5/1998 | Iinuma | 381/104 |
| 5,784,476 | 7/1998 | Bird | 381/106 |

FOREIGN PATENT DOCUMENTS

| | | |
|---|---|---|
| 42-23-906-A1 | 4/1993 | Germany . |
| 05151807-A | 11/1980 | Japan . |
| 06204770-A | 7/1994 | Japan . |
| 06303063-A | 10/1994 | Japan . |
| 2024573 | 1/1980 | United Kingdom ..................... 455/72 |

Primary Examiner—Paul Loomis
Assistant Examiner—Xu Mei
Attorney, Agent, or Firm—Mark Mollon

[57] ABSTRACT

An audio level dynamic range compression circuit 1 comprises a variable gain amplifier 6, an audio signal level averaging stage 8, an analog-to-digital converter 10, and a digital processor 12. The output from the averaging stage 8 is passed to the analog-to-digital converter 10 which has as its output a digital value representative of the level of the averaged audio signal. This digital value is then passed to the digital processor 12 which processes the digital value relative to a predetermined level of the averaged audio signal to produce a gain control output which varies in response to the digital value and which is passed to the variable gain amplifier 6 in order to compress the dynamic range of the output audio signal when the digital value is above the predetermined level. The gain control output is more rapid when the level of the averaged audio signal is rising than when the level of the averaged audio signal is falling.

10 Claims, 3 Drawing Sheets

AUDIO LEVEL DYNAMIC RANGE COMPRESSION

BACKGROUND OF THE INVENTION

The present invention relates to an audio level dynamic range compression circuit, and in particular to a compression circuit for use in a motor vehicle.

Audio sound systems in motor vehicles have been greatly improved in recent years, for example by the provision of additional speakers and use of higher quality audio components, particularly compact disc (CD) players. These improvements have, however, increased the need to deal with the background noise generated by the vehicle's engine, and by wind and road noise. Compact disc players have a greater available dynamic range, up to 96 dB, compared with compact cassettes, or AM or FM radio. Quiet sections of music may become inaudible in the presence of noise inside a motor vehicle.

One approach to deal with this problem, an example of which described in patent document JP 55151807-A, is to measure the noise level inside the vehicle using a microphone in the vehicle and to boost the gain of a variable gain amplifier according to the level of the noise. Another approach, described in patent document JP 06303063-A, is to use a speed sensor and increase the gain at higher speeds. Whilst these systems directly address the problem of a vehicle noise, both loud and quiet sections of audio become amplified in the presence of background noise, even though loud sections may not need amplifying to be audible.

Other types of systems have therefore been proposed which measure the audio level and then boost the level of quiet sections and/or decease the level of loud sections. This, however, leads to the problem that if the audio level is changing, the gain may not be adjusted quickly enough, or may be changed too quickly, which may be irritating or distracting for a listener, or even cause audible distortion. In order to overcome this, it is possible to use delay circuitry, such as a digital memory, so that the gain is adjusted in parallel with changes in audio level; one example of this type of compression circuitry is disclosed in patent document JP 06204770-A.

Although these systems may provide solutions to the problems associated with noise in a motor vehicle, in all of these examples there is a need for additional components, such as microphones or digital memories, and associated circuitry which adds to the cost of the audio compression system. It is therefore an object of the present invention to provide a system for compressing the dynamic range of an audio signal which uses, as far as possible, the components associated with a conventional motor vehicle sound system not having audio compression capability.

SUMMARY OF THE INVENTION

Accordingly, the invention provides an electronic circuit for compressing the dynamic range of an audio signal, the circuit having as its input an input audio signal and having as its output an output audio signal. The circuit comprises a variable gain amplifier, an audio signal level averaging stage, an analog-to-digital converter, and a digital processor, in which both the variable gain amplifier and audio signal averaging stage receive as an input the same input audio signal. The variable gain amplifier has as its output the compressed audio signal and the averaging stage has as its output an analog signal, the level of the analog signal being representative of an average level of the input audio signal. The output from the averaging stage is passed to the analog-to-digital converter which has as its output a digital value representative of the level of the averaged audio signal. The digital value is passed to the digital processor which processes the digital value relative to a predetermined level of the averaged audio signal to produce a gain control output, the gain control output varying in response to the digital value and being passed to the variable gain amplifier in order to compress the dynamic range of the output audio signal when the digital value is above the predetermined level. The digital value is processed so that when the digital value is above the predetermined level the response of the gain control output is more rapid when the level of the averaged audio signal is rising than when the level of the averaged audio signal is falling.

An advantage of the circuit according to the invention is that it permits the use of minimal additional circuitry beyond the components normally associated with a conventional motor vehicle sound system not having audio compression capability. For example, the variable gain amplifier may be the volume control circuitry inside a conventional integrated hybrid audio processor module operating under the control of its integral microprocessor. In the absence of a processed gain control signal, this volume control circuitry may receive as its input via the microprocessor and an internal bus, an electronic signal from the manual volume control knob or switch. The gain control signal may then be combined with the normal manual volume control by the microprocessor in the audio processor to produce the compressed audio output signal.

The additional components needed may then be confined to the circuitry necessary to implement the averaging stage, analog-to-digital (A/D) converter and one digital processor. All of these additional components are relatively inexpensive compared with the relatively complex and expensive digital memories associated with prior art systems.

It is a particular advantage of the circuitry according to the invention that the averaged audio signal level is processed such that increasingly loud audio is attenuated more rapidly than increasingly quiet audio is amplified. However, this capability for rapid or slow change is not needed below the predetermined level, as there is no need to protect the listener quickly from overly loud sections of audio. Therefore, the audio compensation may act relatively slowly below the predetermined level (compared with the rapid attenuation described above), whether the average level of the audio is increasing or decreasing.

Furthermore, for average audio levels below the predetermined level, the amount of compensation of the dynamic range may be made constant (e.g., at an input/output ratio of 1.5:1), or neutral (e.g., at an input/output ratio of 1:1). The compensation below the predetermined level may additionally have a fixed bias, and in the preferred embodiment of the invention, this bias is an overall constant increase in the gain control signal equivalent to an 11 dB boost in the output audio signal. Also in the preferred embodiment of the invention, above the predetermined level, there is a smooth transition between the constant boost bias and the attenuation in the dynamic range, which drops off at a ratio of 2:1. The reason for the bias 11 dB at lower average audio levels is to balance the relatively sharp drop off in gain at higher average audio levels, so that the average volume perceived by the listener for typical music is not unduly increased or decreased when the compensation is turned on or off by the listener.

Since the circuitry is intended for use in providing music or speech audio to the passenger compartment of a motor vehicle, rather than with speech alone (e.g., as in telephony), it is not desirable to produce an output audio signal with a substantially level amplitude, but rather to produce an unobtrusive boost to sections of audio becoming quieter, while at the same time providing a more rapid drop in increasingly loud sections which, while rapid enough to be noticeable is not so rapid as to be obtrusive or to cause distortion in the sound quality.

In order to produce the relatively unobtrusive relative increase in audio level, it is preferred that when the digital value is above the predetermined level and the level of the averaged audio signal is falling, the gain control output changes the gain of the variable gain amplifier at a rate of less than 5 dB/second.

In order to produce the more rapid relative attenuation in audio level, it is preferred that when the digital value is above the predetermined level and the level of the averaged audio signal is rising, the gain control signal changes the gain of the variable gain amplifier at a rate of more than 10 dB/second when the average audio signal is high relative to the predetermined level.

Preferably, the digital processor samples the digital value periodically rather than continuously, for example at a rate having a period of between about 1 ms and 50 ms. In a preferred embodiment of the invention, the sampling rate is about once every 15 ms. Then the gain control signal may be adjusted at up to about 66 times per second—a rate which permits rapid changes in the gain control signal when the audio level is above the predetermined level and average level is increasing.

The cost of the A/D converter may be kept low if it has a resolution of just 8 bits, giving a maximum total of 256 steps. The maximum dynamic range of audio from a CD is 96 dB. The 8 bits used can resolve 48 dB, which is adequate in this particular application.

In general, the audio level in a motor vehicle will not be set as loud by the listener as may be the case with listeners using headsets or headphones. There is therefore no need, as may be case for example with telephonists, to protect completely the listener from sudden loud excursions, for example with peak clipping circuitry. As a result there is also no need for relatively complicated circuitry with such features as delay memories or feed-forward control of the audio level. This permits the use of mainly standard components and an approach in which both the variable gain amplifier and the signal level averaging circuitry may be fed with the same input audio signal, thereby avoiding the complexity of prior art systems in which signal level averaging circuitry may be fed with a signal from the output of the variable gain amplifier. In general, it is preferred that the gain control output is passed to the variable gain amplifier by means of a digital bus, for example an I2C bus. Although such a bus has bidirectional capability, there is no need for communication to the digital processor producing the gain control output. Such busses are, however, available as standard on available audio processor units, and are therefore a convenient means of passing the gain control signal to the variable gain amplifier.

BRIEF DESCRIPTION OF THE DRAWINGS

The invention will now be described in more detail by way of example only, with reference to the following illustrations.

DETAILED DESCRIPTION OF PREFERRED EMBODIMENTS

Figure 1:
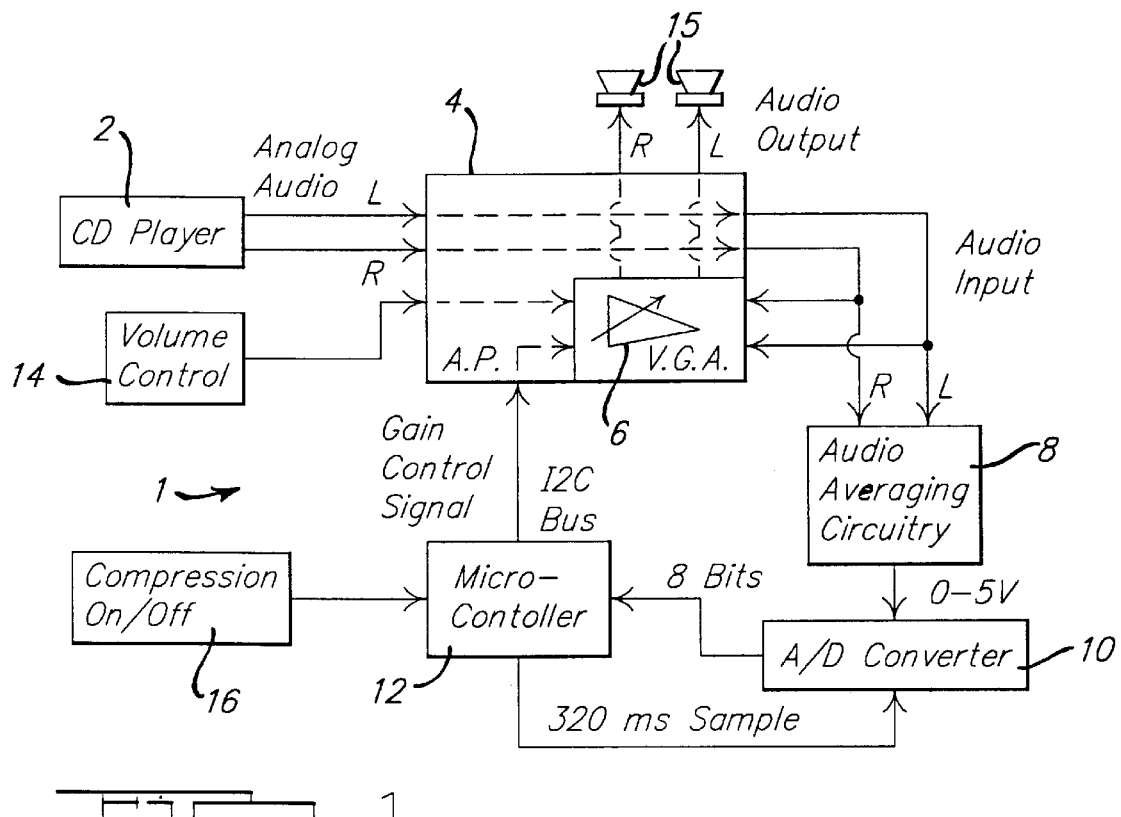
FIG. 1 is a block circuit diagram of an electronic circuit for compressing the dynamic range of an audio signal according to the invention.

Referring first to FIG. 1, an audio system 1 for a motor vehicle comprises a CD player 2, the stereo digital output of which is fed to a hybrid integrated audio processor 4. The audio processor is part number TDA 7340 manufactured by SGS-Thomson. The audio processor 4 receives analog (R) and left (L) channels from the CD player. These audio input signals are available on the outputs of the audio processor, and are passed as inputs both to inputs for a variable gain amplifier 6 inside the audio processor and to audio level averaging circuitry 8.

The averaging circuitry averages both left and right channels, with a time constant of the order of about 5 ms to produce a single analog 0–5 V output, which is passed to an analog-to-digital (A/D) converter 10. The A/D converter is, in fact, integrated within a microcontroller chip 12 part number 68HC11 manufactured by Motorola. The chip 12 is controlled by firmware which will be described in more detail below, which clocks in from the A/D converter an 8-bit value representative of the averaged input audio level. Depending on the level of this digital value, the microcontroller 12 sends a gain control signal to the audio processor 4, which takes this signal and combines it with a volume control signal from a volume control 14. The gain control signal and the volume control signal together set the level of an output audio signal passed to left and right speakers 15.

Because a listener may not always need to have the compression operable, for example if the motor vehicle is stationary, the audio system comprises a compression on/off switch 16. When the compression is off, only the manual volume control 14 sets the level of the output audio signal.

Figure 2:
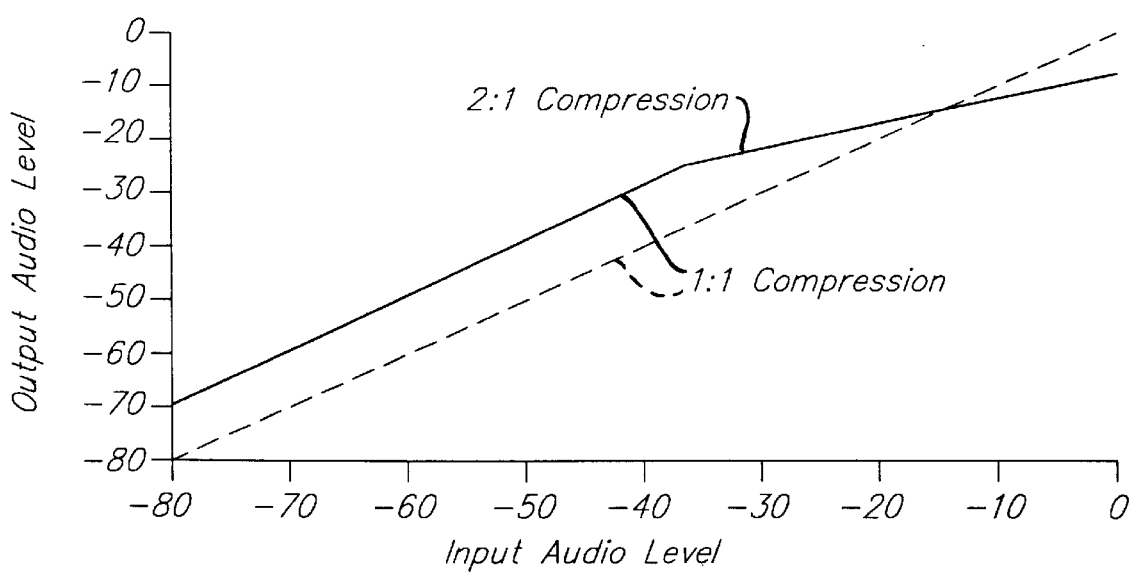
FIG. 2 is a plot of input and output audio signal level showing the amount of compression produced by the circuitry according to the invention.

The compression scheme used with the electronic circuit according to the invention is illustrated in FIG. 2, which shows a plot in decibels (dB) of Output Audio Level vs. Input Audio Level. Although the dynamic range of a CD player is up to 96 dB, for clarity the plot is only down to −80 dB from the maximum full input and output audio levels extended.

The dashed line on the plot is for compression turned off, which gives a compression ratio of 1:1. When the compression is turned on the compression characteristic is shown by the solid line. This line is parallel to but shifted upwards by 11 dB from the no compression line below a predetermined point P on the line, which is at an input audio level of −36 dB. Above the predetermined point P there is a sharp but smooth (i.e., non-discontinuous) transition to a region having a constant compression at a ratio of 2:1. It will be noted that the 2:1 compression region drops below the 1:1 compression line at a crossover point C, which is at an input audio level of about −16 dB, so input audio above the crossover point C is attenuated. The whole of the 2:1 compression region is, of course relatively attenuated with respect to the 1:1 compression region.

It has been found that listeners in the environment of a motor vehicle passenger compartment subjectively prefer this shape of compression curve, because relatively quiet audio is significantly boosted in volume by 11 dB relative to louder audio, thereby making quiet sections of audio more audible in the presence of background noise, while at the same time neither increasing nor decreasing significantly the perceived average volume level of typical audio, for example of music from a CD player.

Figure 3:
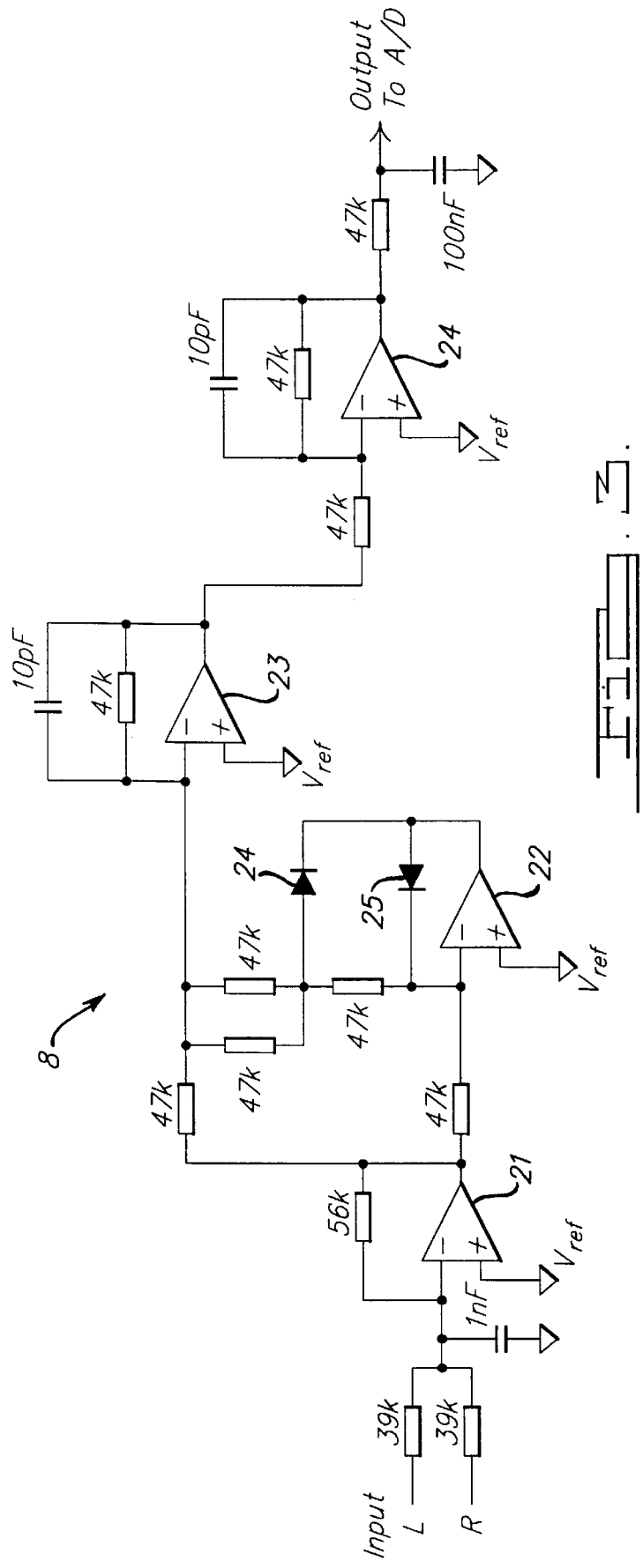
FIG. 3 is a circuit diagram of the audio signal averaging circuitry.

FIG. 3 shows a preferred embodiment of the input audio signal averaging circuitry. The circuitry comprises four identical operational amplifiers 21–24 which are all integrated in one package with four op-amps, type LM837. Amplifier 21 is an input buffer stage; amplifier 22 together with diodes 24,25 rectify the output from the buffering stage; and the pair of amplifiers 23,24 connected in series are output buffers. Although two output buffers in series are not strictly necessary, these are used here for ease of implementation, with the last op-amp simply inverting the signal.

Figure 4:
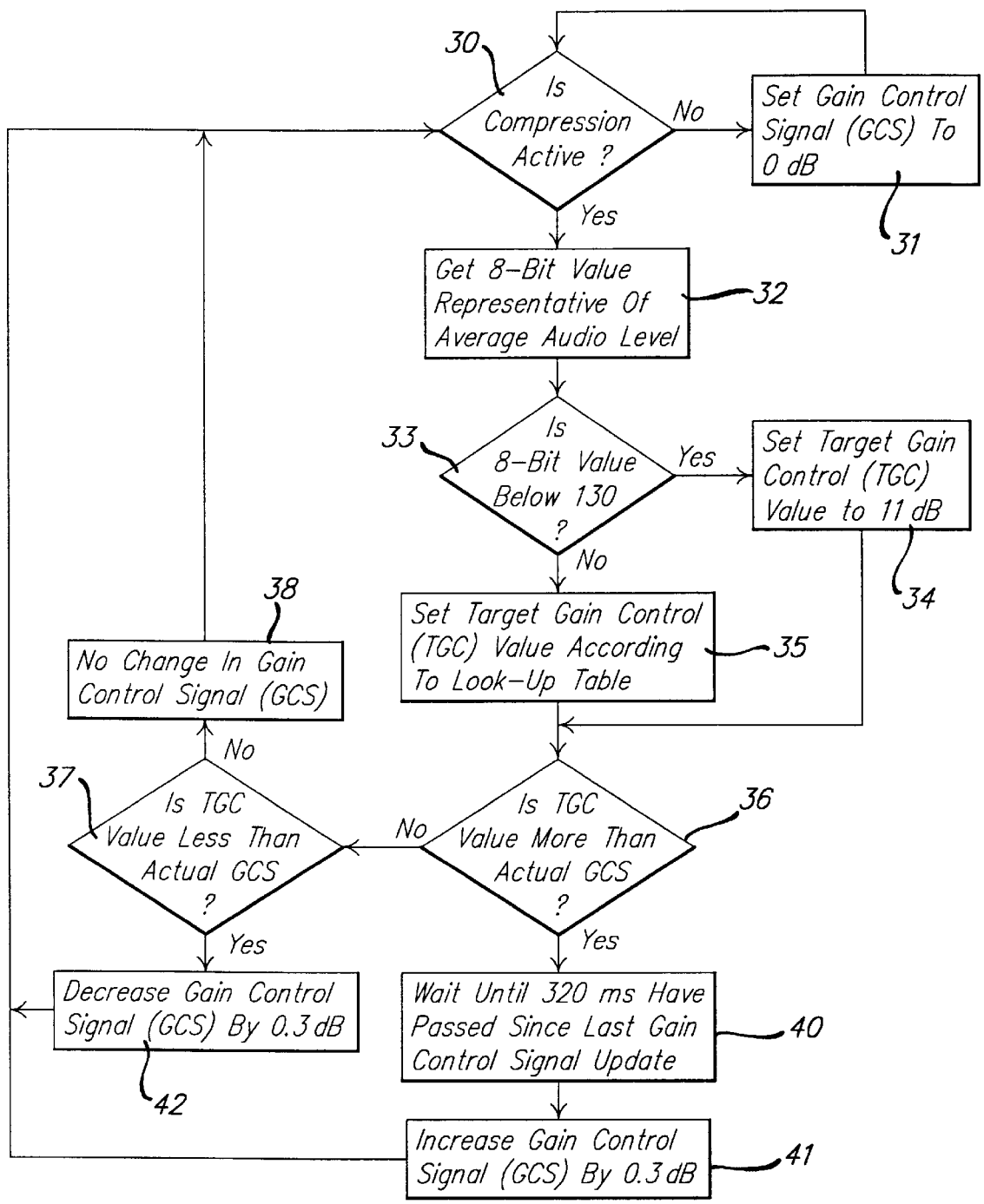
FIG. 4 is a flow diagram of the software used in the digital processor to compute the amount of audio attenuation or boost.

FIG. 4 describes the concepts behind the firmware control of the microcontroller 12. If step 30 determines that the compression is off, then the gain control signal (GCS), here defined as the deviation from the 1:1 neutral compression line shown in FIG. 2, is set to 0 dB in step 31.

When step 30 determines that the gain control is switched on, the microcontroller 12 gets the 8-bit value from the A/D converter 10 in step 32, and compares this with a predetermined value in step 33 (here the number chosen as 130). This predetermined value corresponds with the predetermined point P on the plot of FIG. 2 between the upwardly biased 1:1 compression line and the 2:1 compression line at higher input audio levels. If the 8-bit value is below 130, then a target gain control (TGC) value is set to 11 dB in step 34, otherwise the microcontroller looks up the target gain control value in a look-up table in step 35, although the actual gain control signal (GCS) is still 0 dB.

If the TGC value is equal to the actual GCS as determined by steps 36 and 37, then there is no need to update the GCS, and the loop returns to the beginning via step 38. However, if the TGC is not the same as the GCS, then the GCS must be updated.

The GCS can be incremented or decremented by a minimum amount which equates, at the variable gain amplifier, to an audio level of 0.3 dB. If the GCS needs to be increased (i.e., if step 36 determines that the TGC value is greater than the actual GCS value), which it would be if the average audio level is decreasing or if the compensation has recently been turned on at an average input audio level below the crossover point C, then the software waits in step 40 until 320 ms has elapsed since the last update of the GCS, and then increments the GCS by this minimum 0.3 dB amount is step 41.

If the GCS needs to be decreased (i.e., if step 37 determines that the TGC value less than the actual GCS value), which it would be if the average audio level is increasing or if the compensation has recently been turned on at an average input audio level above the crossover point C, then the software does not wait, but immediately decrements the GCS in step 42, again by the minimum 0.3 dB amount. The cycle time of the firmware is such that the decrements in the GCS come at intervals of 15.22 ms.

The gain of the variable gain amplifier 6 may therefore be attenuated at a rate of 19.7 dB/s, and boosted at a less noticeable rate of 0.94 dB/s.

The electronic circuit and audio system described above are relatively simple and inexpensive to implement in a motor vehicle, and avoid the need to use non-standard and costly components such as microphones and digital delay memories and associated circuitry. The shape of the compression curve also has the benefit of avoiding a sudden perceived shift in audio level when the compression is turned off, particularly for typical CD recorded music. The attenuation of increasingly loud sections of audio is rapid enough to avoid excessive audio power being delivered to the speakers and to listener's ears, but not so rapid as to lead to distortion or clipping of transient loud passages. During quiet sections, the audio level is gradually ramped upwards in order to reduce any perceived effect.

Although the invention has been described above in terms of a preferred embodiment, it will be readily apparent to those skilled in the art that various changes and modifications can be made to the circuitry and control software without departing from the spirit of the invention. Accordingly, the scope of the invention is limited only insofar as indicated in the appended claims.

What is claimed is:

1. An electronic circuit for compressing the dynamic range of an audio signal, the circuit having as its input an input audio signal and having as its output an output audio signal, the circuit comprising a variable gain amplifier, an audio signal level averaging stage, an analog-to-digital converter, and a digital processor, in which both the variable gain amplifier and audio signal averaging stage receive as an input the same input audio signal, the variable gain amplifier having as its output the compressed audio signal, the averaging stage having as its output an analog signal, the level of the analog signal being representative of an average level of the input audio signal, the output from the averaging stage being passed to the analog-to-digital converter which has as its output a digital value representative of the level of the averaged audio signal, the digital value being passed to the digital processor which processes the digital value relative to a predetermined level of the averaged audio signal to produce a gain control output, the gain control output varying in response to the digital value and being passed to the variable gain amplifier in order to compress the dynamic range of the output audio signal when the digital value is above the predetermined level, wherein the digital value is processed so that when the digital value is above the predetermined level the response of the gain control output is more rapid when the level of the averaged audio signal is rising than when the level of the averaged audio signal is falling.

2. An electronic circuit as claimed in claim 1, wherein the gain control output is passed to the variable gain amplifier by means of a digital bus.

3. An electronic circuit as claimed in claim 1, wherein when the digital value is above the predetermined level and the level of the averaged audio signal is falling, the gain control output changes the gain of the variable gain amplifier at a rate of less than 5 dB/second.

4. An electronic circuit as claimed in claim 1, wherein when the digital value is above the predetermined level and the level of the averaged audio signal is rising, the gain control signal changes the gain of the variable gain amplifier at a rate of more than 10 dB/second when the average audio signal is high relative to the predetermined level.

5. An electronic circuit as claimed in claim 1, in which the circuitry comprises a manual audio level control, the gain of the variable gain amplifier being set by both the manual audio level control and the gain control signal.

6. An electronic circuit as claimed in claim 1, in which the digital processor samples the digital value at a rate having a period of between about 1 ms and 50 ms.

7. An electronic circuit as claimed in claim 1, in which the output audio signal is not compressed when the digital value is below the predetermined level.

8. An electronic circuit as claimed in claim 7, in which the output audio signal is compressed at a ratio of about 2:1 when the digital value is above the predetermined level.

9. An electronic circuit as claimed in claim 8, in which the output audio signal is boosted by a constant bias when the digital value is below the predetermined level, a smooth transition in compensation being provided as the digital value rises above the predetermined level.

10. An electronic circuit as claimed in claim 1, in which the circuit comprises a volume control which may be manually set, a volume control signal being passed to the variable gain amplifier and combined with the gain control signal to set the level of the output audio signal.

* * * * *